(12) United States Patent
Kozaki et al.

(10) Patent No.: US 6,653,046 B2
(45) Date of Patent: Nov. 25, 2003

(54) INFRARED SENSITIVE COATING LIQUID

(75) Inventors: Shuji Kozaki, Fujinomiya (JP); Shusaku Tabata, Fuji (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 0 days.

(21) Appl. No.: 09/958,341

(22) PCT Filed: Feb. 8, 2001

(86) PCT No.: PCT/JP01/00894

§ 371 (c)(1),
(2), (4) Date: Oct. 9, 2001

(87) PCT Pub. No.: WO01/59022

PCT Pub. Date: Aug. 16, 2001

(65) Prior Publication Data

US 2002/0187429 A1 Dec. 12, 2002

(30) Foreign Application Priority Data

Feb. 9, 2000 (JP) ........................................ 2000-031625

(51) Int. Cl.$^7$ ................................................ G03F 7/095
(52) U.S. Cl. .................... 430/270.1; 430/271.1; 430/273.1; 430/302; 430/327; 430/348; 430/495.1; 430/496; 430/944; 430/945; 430/964
(58) Field of Search .................. 430/270.1, 271.1, 430/273.1, 302, 348, 495.1, 496, 944, 945, 327, 964

(56) References Cited

U.S. PATENT DOCUMENTS

| | | | | |
|---|---|---|---|---|
| 4,845,008 | A | | 7/1989 | Nishioka et al. ............. 430/165 |
| 5,858,604 | A | * | 1/1999 | Takeda et al. ............... 430/162 |
| 5,919,600 | A | * | 7/1999 | Huang et al. ............. 430/272.1 |
| 6,004,728 | A | * | 12/1999 | Deroover et al. ........... 430/302 |
| 6,060,218 | A | * | 5/2000 | Van Damme et al. ........ 430/302 |
| 6,083,663 | A | * | 7/2000 | Vermeersch et al. ........ 430/302 |
| 6,085,655 | A | * | 7/2000 | Harris et al. ................ 101/456 |
| 6,096,481 | A | * | 8/2000 | Vermeersch et al. ........ 430/302 |
| 6,153,353 | A | * | 11/2000 | Van Damme et al. ... 430/270.1 |
| 6,235,451 | B1 | * | 5/2001 | Damme et al. .............. 430/302 |
| 6,245,481 | B1 | * | 6/2001 | Teng ....................... 430/270.1 |
| 6,245,486 | B1 | * | 6/2001 | Teng ........................... 430/303 |
| 6,251,563 | B1 | * | 6/2001 | Van Damme et al. ...... 430/302 |
| 6,284,431 | B1 | * | 9/2001 | Tanizaki et al. ......... 430/273.1 |
| 6,352,812 | B1 | * | 3/2002 | Shimazu et al. .......... 430/273.1 |
| 6,358,669 | B1 | * | 3/2002 | Savariar-Hauck et al. ........................ 430/273.1 |
| 6,379,863 | B1 | * | 4/2002 | Oohashi et al. .......... 430/270.1 |
| 6,410,208 | B1 | * | 6/2002 | Teng .......................... 430/302 |
| 6,447,977 | B2 | * | 9/2002 | Vermeersch et al. ..... 430/270.1 |
| 6,451,505 | B1 | * | 9/2002 | Patel et al. .............. 430/273.1 |
| 2001/0053498 | A1 | * | 12/2001 | Fujimoto et al. ........ 430/273.1 |

FOREIGN PATENT DOCUMENTS

| | | |
|---|---|---|
| DE | 37 05 342 A1 | 8/1987 |
| EP | 0 901 902 A2 | 3/1999 |
| EP | 0 908 788 A2 | 4/1999 |
| EP | 1 069 472 A1 | 1/2001 |
| JP | 55-48744 | 4/1980 |
| JP | 62-251739 | 11/1987 |
| JP | 5-134410 | 5/1993 |
| JP | 8134367 A | 5/1996 |
| JP | 8-305030 | 11/1996 |
| JP | 9-166875 | 6/1997 |
| JP | 10-16175 | 1/1998 |
| JP | 2000-267262 | 9/2000 |
| JP | 2000-267263 | 9/2000 |
| JP | 2000-267264 | 9/2000 |

\* cited by examiner

*Primary Examiner*—Janet Baxter
*Assistant Examiner*—Barbara Gilliam
(74) *Attorney, Agent, or Firm*—Birch, Stewart, Kolasch & Birch, LLP

(57) ABSTRACT

There are provided a coating liquid for providing an infrared sensitive layer on a photosensitive resin surface, which is obtained by dissolving or dispersing in a specific ester solvent a binder polymer soluble in the solvent, an infrared absorbing substance and, if desired, a non-infrared opaque substance, and a process for obtaining a seamless photosensitive resin sleeve printing plate, which comprises using the same. In a photosensitive structure for a flexographic printing plate suitable for a plate making process comprising directly image-drawing with an infrared laser, the infrared sensitive coating liquid in accordance with the present invention is effective for obtaining a seamless photosensitive printing plate superior in ink coverage with advantages such that an infrared sensitive layer can be formed without any fault such as pinholes even on a photosensitive resin surface having a roughness caused by polishing with a grinder, repeat use of a squeegee rubber can be made possible in the case of carrying out a coating with a ring coater as a means for coating an infrared sensitive coating liquid, a work environment in a coating step of providing an infrared sensitive layer can be improved, the risk of an ignition explosion can be reduced, and moreover a roughness of a photosensitive resin surface caused by polishing with a grinder can be mitigated.

10 Claims, No Drawings

INFRARED SENSITIVE COATING LIQUID

TECHNICAL FIELD

The present invention relates to a coating liquid for forming an infrared sensitive layer removable by an infrared laser, which coating liquid is used for the formation of a flexographic printing plate suitable for a plate making process comprising directly drawing an image of digitized information by an infrared laser without use of a negative film, and also relates to a process for obtaining a seamless photosensitive resin sleeve printing plate, which comprises using said coating liquid.

BACKGROUND ART

As disclosed in JP-A-55-48744 and JP-A 5-134410, it is general that a usual flexographic printing plate is formed in a manner such that a photosensitive elastomer composition is used and subjected to image-exposure through a negative film, and an unexposed portion is washed away. When used for printing, the thus obtained printing plate is affixed to a cylinder of a printer, and on this occasion, there is required much time for an operation to affix it to an accurately determined position, and therefore, it is desired to simplify or, if possible, omit the operation.

For this purpose, it is practiced that a printing plate is processed into a sleeve form prior to the image-exposure. In this case, however, when a pattern continuing without interruption is required to be printed, it has been required that a naturally board like photosensitive resin be wound around a sleeve or the like and thereafter a seam potion in the plate be treated to disappear.

As a process for obtaining a seamless printing plate of a sleeve form, there has been applied a process according to which a board like photosensitive resin is wound around a sleeve or the like, a liquid resin similar thereto or a photosensitive elastomer composition is dissolved in a solvent to be used as an adhesive agent for bonding the seam, and a protuberance produced on the seam portion is, for example, shaved to make it seamless. However, there are required skill and a long time for completing such an operation, and moreover it is difficult to make the seam completely disappear, and therefore, it has been desired to develop a process for simply obtaining a completely seamless plate.

As a process for obtaining a completely seamless plate of a sleeve form, there has been applied a process according to which a board like photosensitive resin is wounded around a sleeve, followed by heating at a temperature not lower than a softening temperature of said photosensitive resin to make the seam disappear, and successively followed by polishing the surface thereof with a grinder, thereby obtaining a highly accurate seamless photosensitive resin layer. According to the process, it has been made possible to obtain a highly accurate seamless photosensitive resin layer of a sleeve form. However, there has never been obtained a seamless printing plate, because when a negative film is bonded with the above-mentioned photosensitive resin layer of a sleeve form, followed by exposure, ends of the negative film overlap each other, and as a result, a figure different in level appears on that portion of the resulting printing plate.

In recent years, as disclosed in JP-A-8-305030 and JP-A-9-166875, there has been developed a process according to which an infrared sensitive layer, which is removable by an infrared laser and which has a property of screening non-infrared rays, is provided on the surface of a photosensitive resin, and a mask is formed by image-drawing with an infrared laser, followed by successive image-exposure through the mask, development and drying, whereby a printing plate can be obtained.

Using such technology, it has been also attempted that a seamless infrared sensitive layer is provided on a seamless photosensitive resin layer, and a mask is formed using an infrared laser, followed by image-exposure through the mask, development and drying to obtain a seamless printing plate.

In this case, in order to provide the infrared sensitive layer, which is removable by an infrared laser and which has a property of screening non-infrared rays, on the photosensitive resin layer, there is applied a process comprising coating a solution containing a component capable of constituting the infrared sensitive layer.

However, the photosensitive resin surface polished with a grinder has roughness, and therefore, there has been left a problem such that faults such as pinholes easily occur when an infrared sensitive coating liquid is coated on said surface. Further, there has been left a problem such that ink coverage on printing becomes inferior due to the roughness.

When the infrared sensitive composition disclosed in the above-mentioned literatures is used as its solution, it is frequent that an organic solvent such as toluene is used as a solvent. Therefore, there has been also left a problem such that in the case where a ring coater is used for the coating formation of the infrared sensitive layer on the photosensitive resin layer, a squeegee rubber of the ring coater is subjected to great swell-deformation by the action of the solvent, and as a result, it is forced to renew the squeegee rubber at every coating.

Moreover, the solvent as disclosed in the above-mentioned literatures deteriorates a work environment and accompanies the risk of a fire and an explosion, and therefore a high safety solvent has been desired.

Accordingly, it has been desired to develop a coating liquid, which is capable of forming an infrared sensitive layer without occurrence of faults such as pinholes even on the photosensitive resin having a rough surface caused by polishing with a grinder, and which is little in its effect on the swell-deformation of rubber and high in safety, and also to develop a process for obtaining a seamless photosensitive resin sleeve printing plate superior in its ink coverage.

DISCLOSURE OF INVENTION

The present invention provides a process for obtaining a seamless photosensitive resin sleeve printing plate, according to which problems of the prior art as mentioned above can be solved. That is, the present invention provides a process for obtaining a seamless photosensitive sleeve printing plate that is superior in its ink coverage, according to which an infrared sensitive layer can be formed without any fault such as pinholes even on a photosensitive resin surface having a roughness caused by polishing with a grinder, repeat use of a squeegee rubber can be made possible in the case of carrying out a coating with a ring coater as a means for coating an infrared sensitive coating liquid, a work environment in a coating step of providing an infrared sensitive layer can be improved, the risk of an ignition explosion can be reduced, and moreover a roughness of a photosensitive resin surface caused by polishing with a grinder can be mitigated The present inventors have undertaken extensive studies to solve the above-mentioned problems, and as a result, it has been found that when a liquid obtained by dissolving or dispersing a binder polymer soluble in a solvent defined below, an infrared absorbing substance and, if desired, a non-infrared opaque substance in a solvent, which comprises an ester solvent represented by a general formula (A), is used as an infrared sensitive coating liquid, it thereby solves the above-mentioned problems, and as a result, the present invention has been accomplished.

$$R^1COOR^2 \qquad (A)$$

In the formula, $R^1$ is $CH_3$ or $C_2H_5$, and $R^2$ is an alkyl group represented by $-C_nH_{2n+1}$, wherein n is an integer of 6 to 10, a substituted or unsubstituted cycloalkyl group represented by $-C_6H_{10}X$, wherein X is H or an alkyl group having 1 to 4 carbon atoms, an aralkyl group represented by $-C_nH_{2n}Ar$, wherein Ar is an aromatic group and n is 1 or 2, or an alkoxypolyoxyalkylenyl group represented by $-(C_nH_{2n}O)_aC_mH_{2m+1}$, wherein n is an integer of 2 to 6, m is an integer of 1 to 4, and a is 1 or 2, provided that $a/(na+m) \leq 1/4$.

That is, the present invention provides a coating liquid for providing an infrared sensitive layer on the surface of a photosensitive resin, which is obtained by dissolving or dispersing in a specific ester type solvent a binder polymer soluble in the solvent, an infrared absorbing substance and, if desired, a non-infrared opaque substance, and a process for obtaining a photosensitive resin sleeve printing plate, which comprises using said coating liquid.

BEST MODE FOR CARRYING OUT THE INVENTION

The present invention is illustrated in detail as follows.

The coating liquid in accordance with the present invention is an infrared sensitive coating liquid capable of giving a non-infrared opaque layer, which is removable by an infrared laser and that is obtained by dissolving or dispersing in a specific ester type solvent a binder polymer soluble in the solvent, an infrared absorbing substance and, if desired, a non-infrared opaque substance. The infrared absorbing substance may serve also as the non-infrared opaque substance. Depending upon properties required, the coating liquid may contain additives such as surface active agents, dispersing agents and antifoaming agents.

The non-infrared rays in the present invention mean electromagnetic waves having a wavelength region other than that of an infrared ray, and include ultraviolet rays and visible rays having a wavelength of not more than about 750 nm. The non-infrared opaque property means a property to be opaque or substantially opaque to non-infrared rays.

The compound represented by the general formula (A) and used in the present invention as the solvent of the infrared sensitive coating liquid is an ester of acetic acid or propionic acid, and specific examples thereof are heptyl acetate, 2-ethylhexyl acetate, 3,5,5-trimethylhexyl acetate, heptyl propionate, 2-ethylhexyl propionate, cyclohexyl acetate, ethylcyclohexyl acetate, t-butylcyclohexyl acetate, cyclohexyl propionate, benzyl acetate, benzyl propionate, 2-phenylethyl acetate, 3-methoxybutyl acetate, 3-methoxybutyl propionate, 3-methoxy-3-methylbutyl acetate, 2-butoxyethyl acetate, 2-butoxybutyl acetate, 4-butoxybutyl acetate and 4-(4'-metoxybutoxy)butyl acetate. These solvents are characterized in that the infrared sensitive layer can be formed without faults such as pinholes even on the rough surface caused by polishing with a grinder, because these solvents exhibit a superior wetting property to a flexographic printing photosensitive resin and have appropriate solubility to a layer of said photosensitive resin.

Further, the above-mentioned solvents may be used each alone, or when used, two or more of the above-mentioned solvents may be optionally combined, and it is permitted to use those containing any isomer produced during an industrial production step such as, for example, nonyl acetate. In addition, it is permitted to combine a solvent other than those mentioned above in a proportion of not more than 50% by weight, for example, from 1 to 50% by weight.

Among these, an ester solvent represented by a general formula (B) is particularly superior, because when it is used, dispersion stability of the infrared absorbing substance becomes satisfactory, an odor of the coating liquid is soft so as to make a work environment favorable, and moreover it is high in its flash point, so that the risk of a fire or an explosion is little.

$$CH_3COOR^1 \qquad (B)$$

In the formula, $R^1$ is an alkoxyalkylenyl group represented by $-C_nH_{2n}OC_mH_{2m+1}$, wherein n is an integer of 2 to 6, and m is an integer of 1 to 4.

As the binder polymer of the infrared sensitive coating liquid in accordance with the present invention, there are used those which are soluble in the aforementioned ester solvent, and which are desirably superior in their bonding property to the photosensitive resin layer and that are further difficult to have exhibit tackiness, when bonded with the photosensitive resin. Specific examples thereof are thermoplastic elastomers such as styrene-butadiene-styrene block copolymer and styrene-isoprene-styrene block copolymer, which can be obtained by polymerizing a mono-vinyl substituted aromatic hydrocarbon with a conjugated diene, cellulose derivatives such as ethyl cellulose and hydroxyalkyl cellulose, polyester and polyvinyl chloride.

Among these, particularly the thermoplastic elastomers obtained by polymerizing a mono-vinyl substituted aromatic hydrocarbon with a conjugated diene are particularly preferred from a viewpoint such that any kind of developers can be selected for a step of washing away unexposed portions both in the infrared sensitive layer and the photosensitive resin layer.

A proportion of the binder polymer in the infrared sensitive layer can be determined within a range at which sensibility can be ensured to attain the removal with an infrared laser beam to be used, and a film strength required for the infrared sensitive layer can be ensured. The binder polymer can be blended in a proportion of from 40 to 90% by weight, more preferably from 55 to 75% by weight.

As the infrared absorbing substance used in combination with said binder, there can be used either a single substance or a compound having an intensive absorption within a wavelength range of usually from 750 to 2000 nm. Examples thereof are inorganic pigments such as carbon black, graphite, copper chromite and chromium oxide, and coloring matters such as polyphthalocyanine compounds, cyanine colors, chroconium colors and metal thiolate colors. Such an infrared sensitive absorbing substance can be added within a range at which sensibility can be imparted to attain the removal with an infrared laser beam to be used. In general, the infrared absorbing substance can be added in an amount of from 5 to 60% by weight, more preferably from 25 to 45% by weight, based on the total weight of the infrared sensitive layer.

As the non-infrared opaque substance, those reflecting or absorbing ultraviolet rays can be used. Preferred examples thereof are ultraviolet ray absorbers, carbon black and graphite, and an amount thereof to be added can be determined so as to attain a desired optical density. In general, the non-infrared opaque substance can be added so as to attain an optical density of not less than 2.0, preferably not less than 3.0. Incidentally, it is permitted that the infrared absorbing substance and the non-infrared opaque substance are the same.

To the infrared sensitive coating liquid in accordance with the present invention, high molecular weight nonionic surface active agents and dispersing agents such as phosphoric acid esters of polyoxyethylene alkyl ether can be added to improve dispersibility of the infrared absorbing substance and the non-infrared screening substance to a solution.

To the infrared sensitive coating liquid in accordance with the present invention, defoaming agents such as silicones, long chain alcohols, aliphatic esters and metal soaps can be added to inhibit bubbles when the coating liquid is poured from one vessel to another or break the formed bubbles within a short period of time.

To the infrared sensitive coating liquid in accordance with the present invention, surface active agents such as perfluoroalkyl compounds can be added to improve leveling property of the coating liquid to the photosensitive resin having a rough surface caused by polishing with a grinder.

A total concentration of the constituents other than the solvent in the infrared sensitive coating liquid in accordance with the present invention is usually from 2 to 40% by weight, and the constituents are dissolved or dispersed in the solvent.

In preparing the infrared sensitive coating liquid, there are applied effectively a process wherein the solvent is directly added to the binder polymer, infrared absorbing substance and non-infrared opaque substance, followed by forced stirring with a stirring blade, dispersion with a ball mill, stirring making use of supersonic wave or a combination thereof, and a process wherein the binder polymer, infrared absorbing substance and non-infrared opaque substance are pre-kneaded using an extruder or a kneader, followed by dissolution in the solvent.

In addition, after completion of blending, it is recommendable to remove solid matters including dusts, foreign matters and dispersion rests with use of, for example, a cartridge filter. It is desired to use a filter having a fineness of about $1\mu$.

The seamless photosensitive resin sleeve printing plate can be obtained through a step of using the infrared sensitive coating liquid to form a seamless infrared sensitive layer on the surface of a photosensitive resin sleeve seamlessly formed.

As a process for forming the infrared sensitive layer on the surface of the photosensitive resin sleeve, for example, it can be conducted that the infrared sensitive coating liquid is directly coated on the surface of the photosensitive resin sleeve, or a film is formed in advance from the infrared sensitive coating liquid, and then laminated on the surface of the photosensitive resin sleeve.

As a means for directly coating the infrared sensitive coating liquid on the surface of the photosensitive resin sleeve, there are enumerated, for example, ring coater, spray coater, brushing, dip-drawing and roll coater.

A means for laminating a film formed in advance from the infrared sensitive coating liquid on the surface of the photosensitive resin sleeve comprises cylindrically winding the infrared sensitive film around the surface of the photosensitive resin sleeve in the direction of circumference, thereby performing lamination, and removing only a portion of the seam at which the film overlaps each other. From a viewpoint of workability, it is recommendable that first of all, the infrared sensitive coating liquid is coated on a cover sheet of polyester, polypropylene, etc. to form a film thereon, the film integrated with the cover sheet is wound around the photosensitive resin surface to perform lamination, and then the cover sheet is peeled to perform transfer of the film, whereby the infrared sensitive layer can be formed on the photosensitive resin layer. The removal of a portion of the seam at which the film overlaps each other can be carried out by, for example, a process of tear-removing the film overlapping portion, a process of applying suction thereto, a process of blowing it a-way with compressed air or a process of rubbing it with a brush.

Although a thickness of the infrared sensitive layer should be determined in consideration of sensibility to attain the removal by means of an infrared laser and effect of screening the non-infrared rays, it is fixed within a range of usually from 0.1 to 20 g/m$^2$, preferably from 1 to 5 g/m$^2$.

The seamless photosensitive resin sleeve can be obtained usually by winding and fixing a photosensitive resin sheet, if desired, provided with a support film, around a sleeve, followed by heating at a temperature not lower than a softening point of the photosensitive resin to weld the seam, successively followed by polishing with a grinder to make the seam completely disappear and at the same time increase the accuracy of the photosensitive sleeve.

A surface of the thus obtained photosensitive resin sleeve has roughness due to polishing with a grinder, and as a result, it may happen that ink coverage on printing becomes inferior depending upon a degree of the roughness, and when the infrared sensitive coating liquid is directly coated on the rough surface, faults such as squeeze-out and pinholes easily appear on the coated infrared sensitive layer.

As the measure, it is effective to provide a mitigating treatment of the roughness of the photosensitive resin surface between the step of polishing with a grinder and the step of obtaining the infrared sensitive layer. The treatment of the photosensitive resin surface can be carried out by providing a step of treating the photosensitive resin surface with a solvent having solubility to the photosensitive resin or a heating step at a temperature not lower than a softening point of the photosensitive resin.

The solvent used for treating the photosensitive resin surface includes those having solubility to the photosensitive resin and causing stickiness on the photosensitive resin surface when the solvent is coated on the photosensitive resin.

Specific examples of the solvent having a solubility to the photosensitive resin are chlorine solvents such as tetrachloroethylene and 1,1,1-trichloroethane, conventional developing solvents for a flexographic printing plate such as diethylene glycol dimethyl ether, diethylene glycol dibutyl ether, 2-butoxyethyl acetate, 3,5,5-trimethylhexyl acetate and ethyl octanoate which are disclosed in EP 0355789, p-menthane, borneol and D- or L-limonene which are disclosed in JP-A-62-160446, hydrogenated petroleum fractions disclosed in JP-A-2-7056, terpenes disclosed in JP-A-2-255385 and phenyl acetate, phenyl propionate, benzyl acetate, 3-methoxybutyl acetate and butyl acetate diglycol which are disclosed in JP-A-4-018564; toluene, ethyl acetate and methyl ethyl ketone. These may be used each alone or in a mixture thereof.

Considering the fact that there may be left a mark made by wiping, depending upon the kind of the solvent having solubility to the photosensitive resin and the treating process of the plate surface, it is permitted to blend the solvent with another solvent having no solubility to the photosensitive resin such as ethanol, isopropyl alcohol and acetone, in an amount ranging from 1 to 90% by weight.

A surface treatment of the photosensitive resin in the present invention can be carried out according to, for example, a process wherein the surface of the photosensitive resin is wiped with a cloth impregnated with the solvent having solubility to the photosensitive resin, a process wherein the sleeve is dipped in said solvent, or a process wherein said solvent is coated on the surface of the photosensitive resin by means of, for example, a ring coater or a spray coater.

When the surface treatment of the photosensitive resin is carried out according to the wiping process with a cloth impregnated with the solvent, it may happen that there is left a mark made by wiping, and therefore it is recommendable to use a solvent having a low boiling point such as ethyl acetate, toluene and methyl ethyl ketone, as the solvent having solubility to the photosensitive resin, or a blend thereof with a solvent having no solubility to the photosensitive resin.

The surface treatments according to the process of dipping the sleeve in the solvent and the process of coating the solvent on the surface of the photosensitive resin are useful because such a treatment can be carried out under no contact with the surface of the photosensitive resin. Preferable examples of the solvent having solubility to the photosensitive resin, which can be suitably used for these processes, are those having a high boiling point, such as 3-methoxybutyl acetate, butyl acetate diglycol, diethylene glycol dimethyl ether, 3,5,5-trimethylhexyl acetate and D- or L-limonene. Of these, alkoxypolyoxyalkylenyl esters such as 3-methoxybutyl acetate and butyl acetate diglycol, which are mild in their odor, are particularly preferred from a viewpoint of work environment.

The photosensitive resin sleeve printing plate in accordance with the present invention is that obtained by laminating the photosensitive resin on, for example, a nickel sleeve, a plastic sleeve and glass fiber sleeve, which are generally used as a sleeve for flexographic printing.

It is permitted to provide a support layer removable from the sleeve on the sleeve. In such a case, a sleeve like flexographic printing structure having been printed can be peeled together with the support. It is convenient for reusing the sleeve.

If desired, it is permitted to provide a cushion layer such as a urethane foam between the upper side of the sleeve or the support layer and the photosensitive resin layer. Further, if desired, it is permitted to provide an adhesive layer among the support layer, the photosensitive layer and the cushion layer.

As the photosensitive resin used in the present invention, those known to be used for flexographic printing plates can be used. Generally speaking, the resin comprises a binder polymer, at least one ethylenically unsaturated monomer and a photo initiator. The resin can further comprise additives such as a sensitizer, a thermal polymerization inhibitor, a plasticizer and a colorant, depending upon properties required for the photosensitive resin layer.

A typical example of those used as the binder polymer of the photosensitive resin layer is a thermoplastic elastomer obtained by polymerizing a mono-vinyl substituted aromatic hydrocarbon monomer and a conjugated diene monomer. Examples of the mono-vinyl substituted aromatic hydrocarbon monomer to be used are styrene, α-methylstyrene, p-methylstyrene and p-methoxystyrene, examples of the conjugated diene monomer to be used are butadiene and isoprene, and typical examples of the polymer are styrene-butadiene-styrene block copolymer and styrene-isoprene-styrene block copolymer.

At least one ethylenically unsaturated monomer includes those compatible with the binder polymer, and examples thereof are esters of an alcohol such as t-butyl alcohol and lauryl alcohol with acrylic acid or methacrylic acid, maleimide derivatives such as laurylmaleimide, cyclohexylmaleimide and benzylmaleimide, esters of an alcohol with fumaric acid such as dioctyl fumarate, and esters of a polyhydric alcohol with acrylic acid or methacrylic acid such as hexanediol di(meth)acrylate, nonanediol di(meth)acrylate and trimethylolpropane tri(meth)acrylate.

The photo initiator can be selected from conventional polymerization initiators including aromatic ketones such as benzophenone and benzoin ethers such as benzoin methyl ether, benzoin ethyl ether, benzoin isopropyl ether, α-methylolbenzoin methyl ether, α-methoxybenzoin methyl ether and 2,2-diethoxyphenylacetophenone. These may be also used in combination thereof.

The photosensitive resin layer can be prepared in various manners. For example, when used in the composition mentioned above, the materials to be blended are dissolved in a suitable solvent such as chloroform, tetrachloroethylene, methyl ethyl ketone and toluene, thereby performing mixing with one another, and the resulting solution is cast upon a form, followed by evaporation of the solvent, thereby forming a plate. Alternatively, using no solvent, the materials are kneaded with a kneader or a roll mill and then formed into a plate of a desired thickness using an extruder, an injection molding machine or a press.

The sleeve like photosensitive resin can be obtained, for example, according to a process comprising forming the above-mentioned photosensitive resin into a sheet, and winding and fixing the sheet around a sleeve, followed by heating at a temperature not lower than a softening point of the photosensitive resin to weld the seam, successively followed by polishing with a grinder to make the seam completely disappear and at the same time increase accuracy of the photosensitive sleeve, or according to a calendering process.

As an infrared laser used for forming a mask by removing the infrared sensitive layer formed on the photosensitive resin in the form of an image, those having a wavelength of from 750 to 2000 nm can be used. This type of the infrared laser usually includes a semiconductor laser of 750 to 880 nm and Nd-YAG laser of 1060 nm. A unit generating these lasers as well as driving units are controlled by a computer, so that the infrared sensitive layer formed on the photosensitive resin is selectively removed to impart a digitized image information to the photosensitive structure for flexographic printing.

In the case where it becomes necessary to restore the infrared sensitive layer, for example, in the case where in the step of forming the infrared sensitive layer on the surface of the photosensitive resin, it is failed to form the layer due to contamination of the photosensitive resin surface with a foreign matter, or in the case where the infrared sensitive layer once formed is damaged, or in the case where it is wanted to revise a pattern once image-drawn with an infrared laser, it is possible to re-produce a photosensitive resin plate in a manner such that an infrared sensitive layer is removed through the whole image-drawing with an infrared laser, and thereafter another infrared sensitive layer is re-formed.

As a source of ultraviolet rays used for photo-hardening the photosensitive resin layer of the photosensitive structure for flexographic printing after completion of the image-drawing with the laser, for example, there are enumerated a high pressure mercury lamp, an ultraviolet fluorescent lamp, a carbon arc lamp, a xenon lamp and sun-light. A desired relief image can be obtained through exposure to ultraviolet rays from the image side.

Any of those having the property of dissolving the photosensitive resin layer can be used as a developing solvent used for washing away unexposed portions of the infrared sensitive layer and photosensitive resin layer after completion of the irradiation of ultraviolet rays to the photosensitive resin layer to form the image, and, for example, esters such as heptyl acetate and 3-methoxybutyl acetate, hydrocarbons such as petroleum fractions, limonene and decalin, and chlorinated solvents such as tetrachloroethylene can be used.

In addition, it is permitted to use those obtained by mixing said solvent with an alcohol such as propanol, butanol, and pentanol. The washing away of both the infrared sensitive layer and the unexposed portions can be carried out by a jet through a nozzle or by brushing with a brush. The obtained printing plate is rinsed, dried and then finished through post-exposure.

The present invention is illustrated with reference to Examples and others.

EXAMPLE 1

An adhesive agent, MEGAM 11658 (a trade name, manufactured by CHEMETALL (Germany)), was uniformly spray-coated at a wet coating rate of 120 g/m$^2$ on the outer surface of a nickel made printing sleeve having a perimeter of 461.15 mm and a length of 1250 mm, and then dried at 60° C. for 15 minutes. The whole outer surface of the resulting printing sleeve was covered with TGI stocking (a trade name, manufactured by Anderson & Freerant Co. (AV Flexologic Co.)), while stretching the stocking so as to prevent the fibers from overlapping.

A short side of a sheet of a flexographic printing photosensitive resin solid plate, AFP/HD-11 (a trade name, manufactured by Asahi-Kasei Co., a plate thickness of 3.18 mm, a size of 762 mm×1016 mm) was cut to obtain a photosensitive resin sheet having a size of 465.15 mm×1016 mm. A support film was peel-removed from the photosensitive resin sheet, and thereafter the remainder was tightly wound around the outer side of the aforementioned printing sleeve so as to bring the surface appearing after the removal of the support film into contact therewith in such a manner that the side of 465.15 mm lay in parallel to the circumference of the sleeve, and as a result, there was observed a slight clearance between both sides of 1016 mm of the photosensitive resin sheet. A self-adhesive tape was applied to the clearance in a cross direction thereof so as to bring both sides of the photosensitive resin sheet close to each other, whereby the whole of the clearance was covered with the self-adhesive tape.

Successively, a self-adhesive tape was applied on the covering TGI stocking to compactly cover a portion which was not covered with the photosensitive sheet and which appeared at both ends of the resulting printing sleeve, and further another self-adhesive tape was applied to cover a clearance observed between both ends of the sleeve-like photosensitive resin sheet paralleled to the circumference of the sleeve and the printing sleeve, and as a result, there was inhibited an air leak between the sleeve-like photosensitive resin sheet and the printing sleeve.

A vacuum was drawn to evacuate the air between the aforementioned sleeve like photosensitive resin sheet and the printing sleeve through the opening of the TGI stocking, thereby performing a bond between the sleeve like photosensitive resin sheet and the printing sleeve. Under the vacuum-drawing, both ends of PET film (a cover sheet) on the surface of the sleeve like photosensitive resin sheet were cut each 5 cm long in the direction parallel to the sleeve circumference of the photosensitive resin sheet with a cutter knife, further notching was appropriately applied also in the direction parallel to a rotation axis of the printing sleeve, and thereafter the PET film was peel-removed. Furthermore, any slip layer remaining on the surface of the photosensitive resin was also peel-removed using a self-adhesive tape. Successively, under the vacuum-drawing between the sleeve like photosensitive resin sheet and the printing sleeve, the whole was subjected to heat treatment at 130° C. for 20 minutes, whereby the seam of the sleeve like photosensitive resin sheet disappeared.

After removing the remaining self-adhesive tape, PET film and slip layer, the thus obtained seamless photosensitive resin sleeve was set to a grinding machine, SA6/2U×200 (manufactured by Schleif Maschinenwerk Co.), and polished until the circumference of the photosensitive resin sleeve reached 480 mm, whereby the seam completely disappeared.

While rotating at 50 rpm, the photosensitive resin sleeve was wiped with BEMCOT M-3(a trade name of a lint free wiper, manufactured by Asahi-Kasei Co.) impregnated with ethyl acetate, thereby removing polishing wastes and mitigating the roughness of the surface of the photosensitive resin sleeve, and as a result, there was obtained a seamless photosensitive resin sleeve.

A mixture obtained by kneading 60 parts by weight of TUFPREN 315 (a trade name of a styrene-butadiene block copolymer having a styrene content of 22%, manufactured by Asahi-Kasei Co.) and 40 parts by weight of a carbon black having a particle size of 30 nm, an extensive use COLOR BLACK #30 (a trade name, manufactured by Mitsubishi Chemical Corporation) with a kneader was dissolved and dispersed in 3-methoxybutyl acetate to obtain a uniform liquid having a solid concentration of 5% by weight. The liquid was filtered with a 300 mesh SUS and thereafter filtered with a cartridge filter SL-010 having a filtering accuracy of 1μ (a trade name, manufactured by Roki Techno Co.), thereby obtaining an infrared sensitive coating liquid.

The aforementioned photosensitive resin sleeve seamlessly formed was set to a vertical ring coater (manufactured by TAKAGI CHOKOKU Co.) using a soft chloroprene (a thickness of 1 mm, a hardness of 45°) as a squeegee rubber, and the aforementioned infrared sensitive coating liquid was poured to the ring coater until the surface of the liquid reached 10 mm height from the end of the squeegee rubber brought into contact with the photosensitive resin. The infrared sensitive coating liquid was coated on the photosensitive resin in such a manner that the coater portion in which the coating liquid was placed was descended at a rate of 400 mm/min, and thereafter the coated was allowed to stand at room temperature for 30 minutes, thereby forming a uniform infrared sensitive layer freed from faults such as pinholes on the photosensitive resin. In a room wherein the coating and room-temperature drying of the coated sleeve were ongoing, there was felt only a slight odor of the solvent.

The squeegee rubber used for the coating was observed to slightly swell immediately after the coating. However, through drying at room temperature, it restored its original state not only in sense of touch but also in its form, and as a result, the squeegee rubber was found to be resistant to repeated use of not less than 30 times of the coating.

The photosensitive resin sleeve provided with the infrared sensitive layer was subjected to image-drawing with use of an infrared laser setter, thereby forming a photo mask faithfully reproducing image-data.

The whole surface of the photosensitive resin sleeve was exposed in a light exposure of 4000 mJ/cm$^2$ using an ultraviolet fluorescent lamp of 12 mW/cm$^2$, and thereafter washing off of the infrared sensitive layer and washing away of unexposed portions of the photosensitive resin layer were carried out with a brush using a mixed solvent of SOLVESSO 150 (a trade name of a hydrocarbon, manufactured by EXXON CHEMICAL CO.)/benzyl alcohol=4:1 (by volume), followed by drying at 60° C. for 1 hour, whereby there could be obtained a satisfactory seamless flexographic printing plate.

The resulting sleeve-like flexographic printing plate was installed in a flexographic printing machine to carry out a printing, and as a result, there could be obtained a good printed matter superior in ink coverage.

EXAMPLE 2

The whole of the photosensitive resin sleeve, which has been seamlessly formed in a sleeve form in a manner similar to that of Example 1, and whose photosensitive resin surface has been left rough after polishing with a grinder, was subjected to heat treatment at 130° C. for 30 minutes, while continuing vacuum-drawing between the photosensitive resin layer and the sleeve. As a result, it was found that the surface of the sleeve like photosensitive resin was made free from the roughness caused by polishing and made specular.

Using the resulting photosensitive resin sleeve seamlessly formed, the coating with the infrared sensitive coating liquid, image-drawing by means of an infrared laser, exposure, washing off of the infrared sensitive resin layer, washing away of the unexposed portion of the photosensitive resin layer and drying were carried out in each manner similar to that of Example 1, whereby there could be obtained a satisfactory seamless flexographic printing plate.

The resulting sleeve like flexographic printing plate was installed in a flexographic printing machine to carry out a printing, and as a result, there could be obtained a good printed matter superior in ink coverage.

EXAMPLE 3

An infrared sensitive coating liquid obtained in a manner similar to that of Example 1 was continuously coated using a bar coater on a cover sheet, a polypropylene film having a thickness of 22 μm and a width of 1050 mm, so as to make a coating width of 1016 mm and a coating proportion of 3 to 4 g(dry)/m$^2$, respectively, and then dried to obtain an infrared sensitive coating film, which was then wound in a roll form.

The resulting roll of the cover sheet coated with the aforementioned infrared sensitive coating liquid was placed in parallel to a photosensitive resin sleeve seamlessly formed in a sleeve form and surface-treated in a manner similar to that of Example 1, then the roll was drown out, both the width of the coating and the width of the photosensitive resin sleeve (both 1016 mm) were matched, and thereafter taking advantage of tackiness of the photosensitive resin, an end part of the cover sheet was temporarily bonded so as to contact the coated surface with the photosensitive resin layer.

Successively, the cover sheet was wound on the photosensitive resin sleeve while pressing the cover sheet temporarily bonded with a rubber roll having a smooth surface and rotating the sleeve, and when circulated around the photosensitive resin sleeve, the cover sheet was cut with a rolling cutter leaving an excess of about 3 cm from the seam portion. Thereafter, the cover sheet was peeled off to transfer the infrared sensitive resin layer onto the photosensitive resin layer. Then, the excess portion of about 3 cm from the seam portion was pulled by hand, whereby the infrared sensitive coating film could be removed almost along a boundary of the seam, but there was slightly left a portion sticking out the seam. This portion was carefully rubbed to be removed using a toothbrush for domestic use, and as a result, the seamless infrared sensitive layer was provided on the photosensitive resin sleeve.

Using the resulting photosensitive resin sleeve provided with the infrared sensitive layer, the image-drawing by means of an infrared laser, exposure, washing off of the infrared sensitive resin layer, washing away of the unexposed portion of the photosensitive resin layer and drying were carried out in each manner similar to that of Example 1, whereby there could be obtained a good seamless flexographic printing plate.

The resulting sleeve-like flexographic printing plate was installed in a flexographic printing machine to carry out a printing, and as a result, there could be obtained a good printed matter superior in ink coverage.

Comparative Example 1

A mixture obtained by kneading 65 parts by weight of MACROMELT 6900 (a trade name of a polyamide, manufactured by HENKEL Co.) and 35 parts by weight of a carbon black having a particle size of 30 nm, an extensive use COLOR BLACK #30 (a trade name, manufactured by Mitsubishi Chemical Corporation) with a kneader was dissolved and dispersed in a solvent of toluene/1-propanol=1:1 (weight ratio) to obtain a uniform liquid having a solid concentration of 8% by weight. The liquid was filtered in the same manner as in Example 1 to obtain an infrared sensitive coating liquid.

The coating of the infrared sensitive coating liquid was carried out in the same manner as in Example 1, except that the above-mentioned coating liquid was used as the infrared sensitive coating liquid. The resulting sleeve was allowed to stand at room temperature for 10 minutes, whereby the infrared sensitive layer formed on the surface of the photosensitive resin sleeve was found to have faults such as pinholes here and there.

In a room wherein the coating and room-temperature drying of the sleeve coated were ongoing, there was felt a remarkably strong odor of the solvent, so that it was difficult to work therein for a long period of time.

The squeegee rubber used for the coating had resulted in severe swell-deformation and was not restored even after evaporation of the solvent, the surface thereof was sandy in sense of touch, and the hardness thereof was remarkably increased, and as a result, it was found to be impossible to use it repeatedly.

Using the resulting photosensitive resin sleeve provided with the infrared sensitive layer, the image-drawing by means of an infrared laser, exposure, washing off of the infrared sensitive resin layer, washing away of the unexposed portion of the photosensitive resin layer and drying were carried out in the same manner as in Example 1, whereby there were observed dot like images here and there at which there was no image by nature, for example, at a non-image portion. Thus, a satisfactory printing matter could not be obtained.

EXAMPLE 4

Using various solvents and binder polymers for the infrared sensitive coating liquid as shown in Table 1, each seamless printing plate was obtained according to the process of Example 1.

TABLE 1

| Solvent*1 | Binder polymer*2 | Repeat use of squeegee rubber | State of printing plate |
|---|---|---|---|
| B | A | Possible not less than 30 times | Good |
| C | A | Possible not less than 30 times | Good |
| D | A | Possible not less than 30 times | Good |
| A | B | Possible not less than 30 times | Good |
| A | C | Possible not less than 30 times | Good |
| E | A | 10 times | Good |

Note
*1 Solvent#A: 3-Methoxybutyl acetate B: Heptyl acetate C: Cyclohexyl acetate D: Benzyl acetate E: 3-Methoxybutyl acetate: tolene = 45:65 (weight ratio)
*2 Binder polymer#A: TAFPREN 315 (a trade name of styrene-butadiene block copolymer) B: KRATON D1107CP (a trade name of styrene-isoprene block copolymer having a styrene content of 14% by weight, manufactured by SHELL CHEMICAL Co. (Kraton Polymers Co.) C: CAB-381-0.1 (a trade name of cellulose acetate butylate, manufactured by Kodak Co.)

INDUSTRIAL APPLICABILITY

In a process of obtaining a flexographic printing plate suitable for a plate making process wherein an image of a digitized information is directly drawn by an infrared laser without use of a negative film, according to the present invention, there is provided a process for obtaining a seamless photosensitive printing plate superior in ink coverage, according to which an infrared sensitive layer can be formed without any fault such as pinholes even on a photosensitive resin surface having a roughness caused by polishing with a grinder, repeat use of a squeegee rubber can be made possible in the case of carrying out a coating with a ring coater as a means for coating an infrared sensitive coating liquid, a work environment in a coating step of providing an infrared sensitive layer can be improved, the risk of an ignition explosion can be reduced, and moreover a roughness of a photosensitive resin surface caused by polishing with a grinder can be mitigated.

What is claimed is:

1. A coating liquid for providing an infrared sensitive layer on a surface of a photosensitive resin for flexographic printing, wherein the photosensitive resin comprises a thermoplastic elastomer as a binder polymer, at least one ethylenically unsaturated monomer and a photo initiator and wherein the coating liquid is obtained by dissolving or dispersing a thermoplastic elastomer binder polymer soluble in a solvent defined below, an infrared absorbing substance and, optionally a non-infrared opaque substance in a solvent which comprises an ester solvent represented by a general formula (A), $$R^1COOR^2 \quad (A)$$

wherein $R^1$ is $CH_3$ or $C_2H_5$, and $R^2$ is a alkyl group represented by $-C_nH_{2n+1}$, in which n is an integer of 6 to 10, a substituted or unsubstituted cycloalkyl group represented by $-C_6H_{10}X$, in which X is H or an alkyl group having 1 to 4 carbon atoms, an aralkyl group represented by $-C_nH_{2n}Ar$, in which Ar is an aromatic group an n is 1 or 2, or an alkoxypolyoxyalkylenyl group represented by $-(C_nH_{2n}O)_a C_mH_{2m+1}$, in which n is an integer of 2 to 6, m is an integer of 1 to 4 and a is 1 or 2, provided that $a/(na+m) \leq \frac{1}{4}$.

2. The coating liquid according to claim 1, wherein the ester solvent represented by the general formula (A) accounts for not less than 50% by weight of the solvent.

3. The coating liquid according to claim 1 or 2, wherein the ester solvent is represented by a general formula (B), $$CH_3COOR^1 \quad (B)$$

wherein $R^1$ is an alkoxyalkylenyl group represented by $-C_nH_{2n}OC_mH_{2m+1}$, in which n is an integer of from 2 to 6 and m is an integer of from 1 to 4.

4. The coating liquid according to claim 1 or 2, wherein the ester solvent represented by the general formula (A) is selected from the group consisting of heptyl acetate, 2-ethylhexyl acetate, 3,5,5-trimethylhexyl acetate, heptyl propionate, 2-ethylhexyl propionate, cyclohexyl acetate, ethylcyclohexyl acetate, t-butylcyclohexyl acetate, cyclohexyl propionate, benzyl acetate, benzyl propionate, 2-phenylethyl acetate, 3-methoxybutyl acetate, 3-methoxybutyl propionate, 3-methoxy-3-methylbutyl acetate, 2-butoxyethyl acetate, 2-butoxybutyl acetate, 4-butoxybutyl acetate and 4-(4'-methoxybutoxy) butyl acetate.

5. The coating liquid according to claim 1, wherein the thermoplastic elastomer binder polymer of the coating liquid is obtained by polymerizing a mono-vinyl substituted aromatic hydrocarbon and a conjugated diene.

6. A process for obtaining a seamless photosensitive resin sleeve printing plate comprising laminating a photosensitive resin layer on a sleeve, carrying out a treatment to make the seam disappear, polishing the photosensitive resin surface with a grinder, thereby making the seam completely disappear, providing an infrared sensitive layer, forming a mask by means of drawing with an infrared laser, carrying out an image-exposure through the mask and then carrying out a development, wherein the infrared sensitive layer is provided by directly coating the coating liquid according to claim 1 on the photosensitive resin surface.

7. A process for obtaining a seamless photosensitive resin sleeve printing plate comprising laminating a photosensitive resin layer on a sleeve, carrying out a treatment to make the seam disappear, polishing the photosensitive resin surface with a grinder, thereby making the seam completely disappear, providing an infrared sensitive layer, forming a mask by means of drawing with an infrared laser, carrying out an image-exposure through the mask and then carrying out a development, wherein the coating liquid according to claim 1 is formed into a film in advance, the film is cylindrically wound on the photosensitive resin surface in the circumference direction to perform a lamination and only an overlapping portion of the seam is removed to obtain a seamless infrared sensitive layer.

8. The process according to claim 6 or 7, which comprises a step of treating the photosensitive resin surface with a solvent having a solubility to the photosensitive resin between the step of polishing with a grinder and the step of providing the infrared sensitive layer.

9. The process according to claim 6 or 7, which comprises a step of heating at a temperature not lower than a softening point of the photosensitive resin between the step of polishing with a grinder and the step of providing the infrared sensitive layer.

10. The coating liquid according to claim 1, wherein the photo initiator is at least one selected from the group consisting of aromatic ketone and benzoin ether.

* * * * *